United States Patent
Utkovski et al.

(10) Patent No.: US 11,438,042 B2
(45) Date of Patent: Sep. 6, 2022

(54) TRANSMISSION OF DATA BY MULTIPLE USERS OVER SHARED RESOURCES

(71) Applicant: Fraunhofer-Gesellschaft zur Förderung der angewandten Forschung e.V., Munich (DE)

(72) Inventors: Zoran Utkovski, Berlin (DE); Renato Luis Garrido Cavalcante, Berlin (DE); Patrick Agostini, Berlin (DE); Martin Kasparick, Berlin (DE); Bernd Holfeld, Berlin (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 108 days.

(21) Appl. No.: 16/831,400

(22) Filed: Mar. 26, 2020

(65) Prior Publication Data

US 2020/0287603 A1  Sep. 10, 2020

Related U.S. Application Data

(63) Continuation of application No. PCT/EP2018/075935, filed on Sep. 25, 2018.

(30) Foreign Application Priority Data

Sep. 28, 2017  (EP) ..................... 17193878

(51) Int. Cl.
- *H04B 7/0456* (2017.01)
- *H04B 7/06* (2006.01)
- *H04L 27/26* (2006.01)

(52) U.S. Cl.
CPC ......... *H04B 7/0482* (2013.01); *H04B 7/0634* (2013.01); *H04L 27/2607* (2013.01); *H04L 27/2634* (2013.01)

(58) Field of Classification Search
CPC ............... H04B 7/0482; H04B 7/0634; H04L 27/2607; H04L 27/2634
See application file for complete search history.

(56) References Cited

U.S. PATENT DOCUMENTS

| | | | |
|---|---|---|---|
| 7,774,689 B2 * | 8/2010 | Chiu ................. | H03M 13/2972 714/786 |
| 9,544,034 B2 * | 1/2017 | Blankenship ......... | H04L 1/1861 |

(Continued)

FOREIGN PATENT DOCUMENTS

| | | | | |
|---|---|---|---|---|
| EP | 2941076 A1 | 11/2015 | | |
| EP | 3688879 A1 * | 8/2020 | ........ | H04W 72/1268 |

(Continued)

OTHER PUBLICATIONS

Lim et al., Codebook Optimization for the Superposition Transmission of Uplink SCMA Systems, Aug. 1, 2018, IEEE Transactions on Vehicular Technology, vol. 67, Issue 10, pp. 10112-10117, DOI: 10.1109/TVT.2018.2862355 (Year: 2018).*

(Continued)

*Primary Examiner* — Eric Nowlin
(74) *Attorney, Agent, or Firm* — Perkins Coie LLP; Michael A. Glenn

(57) ABSTRACT

A transmitter for transmitting data to a receiver of a wireless communication network, the transmitter includes at least one antenna, a codebook, an encoder, and a transceiver coupled to the encoder and to the at least one antenna. The codebook includes a plurality of codewords, each codeword being a vector including a plurality of symbols, each symbol to be transmitted over resources of the wireless communication network. The encoder is configured to receive an information message to be transmitted to a receiver of the wireless communication network, to select from the codebook the codeword associated with the received information message, and to divide the selected codeword into a plurality (Continued)

of sub-codewords. The transceiver is configured to transmit via the at least one antenna a first sub-codeword, and to transmit via the at least one antenna a second sub-codeword responsive to an indication that the encoded information message was not successfully decoded at the receiver on the basis of the received first sub-codeword.

24 Claims, 6 Drawing Sheets

(56) References Cited

U.S. PATENT DOCUMENTS

| | | | |
|---|---|---|---|
| 9,979,450 B2* | 5/2018 | Jiang | H04W 72/12 |
| 10,141,991 B2* | 11/2018 | Jiang | H04W 28/18 |
| 10,574,315 B2* | 2/2020 | Lee | H04J 11/0036 |
| 10,608,790 B2* | 3/2020 | Nammi | H04L 1/189 |
| 10,666,374 B2* | 5/2020 | Nammi | H04L 5/0048 |
| 10,673,566 B2* | 6/2020 | Aiba | H04W 76/27 |
| 10,736,134 B2* | 8/2020 | Lee | H04L 1/1893 |
| 10,742,234 B2* | 8/2020 | Sun | H03M 13/09 |
| 10,742,271 B2* | 8/2020 | Nammi | H04B 7/04 |
| 10,750,488 B2* | 8/2020 | He | H04L 1/1887 |
| 10,757,732 B2* | 8/2020 | Lee | H04W 74/0816 |
| 10,892,859 B2* | 1/2021 | Lee | H04L 1/0071 |
| 10,912,117 B2* | 2/2021 | Lee | H04W 74/08 |
| 11,063,699 B2* | 7/2021 | Noh | H04L 1/0063 |
| 11,063,705 B2* | 7/2021 | Chou | H04L 1/1614 |
| 11,115,253 B2* | 9/2021 | Lee | H04J 13/10 |
| 2008/0294959 A1 | 11/2008 | Chindapol et al. | |
| 2008/0307427 A1* | 12/2008 | Pi | H03M 13/27 |
| | | | 718/104 |
| 2010/0202386 A1* | 8/2010 | Takaoka | H04L 69/323 |
| | | | 370/329 |
| 2010/0303016 A1* | 12/2010 | Jin | H04L 27/0008 |
| | | | 370/328 |
| 2011/0200016 A1* | 8/2011 | Bergman | H04L 1/1854 |
| | | | 370/335 |
| 2016/0191175 A1 | 6/2016 | Hwang et al. | |
| 2016/0211867 A1* | 7/2016 | Guillemette | H03M 13/1111 |
| 2018/0102877 A1* | 4/2018 | Jiang | H04B 7/0473 |
| 2018/0248597 A1* | 8/2018 | Jiang | H04W 72/12 |
| 2018/0249452 A1* | 8/2018 | Lee | H04L 27/2634 |
| 2018/0302191 A1* | 10/2018 | Park | H04L 5/0055 |
| 2018/0323906 A1* | 11/2018 | Nammi | H04L 1/189 |
| 2018/0324785 A1* | 11/2018 | Nammi | H04W 4/027 |
| 2018/0367202 A1* | 12/2018 | Yang | H04L 1/0071 |
| 2018/0367253 A1* | 12/2018 | Nammi | H04L 1/08 |
| 2018/0375634 A1* | 12/2018 | Sun | H04L 1/06 |
| 2019/0020388 A1* | 1/2019 | Lee | H04B 7/0478 |
| 2019/0045489 A1* | 2/2019 | He | H04W 72/12 |
| 2019/0052415 A1* | 2/2019 | Nammi | H04W 28/04 |
| 2019/0059013 A1* | 2/2019 | Rahman | H04B 7/0695 |
| 2019/0074929 A1* | 3/2019 | Aiba | H04W 76/27 |
| 2019/0089494 A1* | 3/2019 | Park | H04L 1/1809 |
| 2019/0124681 A1* | 4/2019 | Lee | H04L 1/0003 |
| 2019/0141750 A1* | 5/2019 | Lee | H04W 74/0816 |
| 2019/0150191 A1* | 5/2019 | Lee | H04W 74/0816 |
| | | | 370/329 |
| 2019/0165893 A1* | 5/2019 | Khosravirad | H03M 13/6306 |
| 2019/0207734 A1* | 7/2019 | Yang | H04L 1/1864 |
| 2019/0305877 A1* | 10/2019 | Lee | H04W 74/08 |
| 2019/0349965 A1* | 11/2019 | Chakraborty | H04W 72/1284 |
| 2019/0356423 A1* | 11/2019 | Lee | H04L 1/1854 |
| 2020/0014491 A1* | 1/2020 | Takeda | H04L 5/0044 |
| 2020/0099474 A1* | 3/2020 | Wikstrom | H04W 72/042 |
| 2020/0153549 A1* | 5/2020 | Noh | H04L 1/0071 |
| 2020/0186291 A1* | 6/2020 | Nammi | H04L 1/189 |
| 2020/0196335 A1* | 6/2020 | Lei | H04L 1/1671 |
| 2020/0221310 A1* | 7/2020 | Babaei | H04L 1/1671 |
| 2020/0287603 A1* | 9/2020 | Utkovski | H03M 7/3062 |
| 2020/0336179 A1* | 10/2020 | Nammi | H04B 7/04 |
| 2021/0028893 A1* | 1/2021 | Hwang | H04L 5/0064 |
| 2021/0029693 A1* | 1/2021 | Meng | H04W 72/0413 |
| 2021/0111772 A1* | 4/2021 | Lee | H04B 7/216 |
| 2021/0135919 A1* | 5/2021 | Lee | H04W 52/146 |
| 2021/0266105 A1* | 8/2021 | Lei | H04W 72/1289 |
| 2021/0328721 A1* | 10/2021 | Ryu | H04W 72/0406 |
| 2022/0053494 A1* | 2/2022 | Shattil | H04L 27/264 |

FOREIGN PATENT DOCUMENTS

| | | | | |
|---|---|---|---|---|
| WO | 2009120797 A1 | 10/2009 | | |
| WO | 2013119169 A2 | 8/2013 | | |
| WO | WO-2017183845 A1 * | 10/2017 | | H04L 27/2628 |
| WO | WO-2017204469 A1 * | 11/2017 | | H04W 74/08 |
| WO | WO-2017204470 A1 * | 11/2017 | | H04W 74/08 |
| WO | WO-2018128200 A1 * | 7/2018 | | H04L 1/1819 |
| WO | 2019025319 A1 | 2/2019 | | |
| WO | WO-2019063534 A1 * | 4/2019 | | H04L 1/1819 |
| WO | WO-2020006136 A1 * | 1/2020 | | H04L 1/1829 |

OTHER PUBLICATIONS

Taherzadeh et al., SCMA Codebook Design, Sep. 14, 2014, IEEE, 2014 IEEE 80th Vehicular Technology Conference (VTC2014-Fall), DOI: 10.1109/VTCFall.2014.6966170 (Year: 2014).*

Sesia, Stefania, Matthew Baker, and Issam Toufik. "LTE-The UMTS Long Term Evolution: From Theory to Practice," 2nd edition, John Wiley & Sons, 2011, 2011.

B. Wang, L. Dai, T. Mir, and Z. Wang, "Joint User Activity and Data Detection Based on Structured Compressive Sensing for NOMA," IEEE Commun. Lett., vol. 20, No. 7, pp. 1473-1476, Jul. 2016., Jul. 2016.

C. Wei, H. Liu, Z. Zhang, J. Dang, and L. Wu, "Approximate Message Passing-Based Joint User Activity and Data Detection for NOMA," IEEE Commun. Lett., vol. 21, No. 3, pp. 640-643, Mar. 2017, Mar. 2017.

B. Wang, L. Dai, Y. Zhang, T. Mir, and J. Li, "Dynamic Compressive Sensing-Based Multi-User Detection for Uplink Grant-Free NOMA," IEEE Commun. Lett., vol. 20, No. 11, pp. 2320-2323, Nov. 2016., Nov. 2016.

Kumar, N. Vigna, et al., "LDPC—An inevitable code for communication systems", 2014 International Conference on Communication & Signal Processing, IEEE, Apr. 3, 2014, pp. 285-288, XP032680193, DOI: 10.1109/ICCSP.2014.6949846, ISBN: 978-1-4799-3357-0 [retrieved on Nov. 7, 2014].

* cited by examiner

TRANSMISSION OF DATA BY MULTIPLE USERS OVER SHARED RESOURCES

CROSS-REFERENCE TO RELATED APPLICATIONS

This application is a continuation of copending International Application No. PCT/EP2018/075935, filed Sep. 25, 2018, which is incorporated herein by reference in its entirety, and additionally claims priority from European Application No. 17193878.0, filed Sep. 28, 2017, which is also incorporated herein by reference in its entirety.

BACKGROUND OF THE INVENTION

The present invention relates to the field of wireless communication networks or systems, more specifically to the access and transmission of data in such communication networks. Embodiments of the present invention concern an improved transmission of data over shared resources in networks including a massive number of user devices.

FIG. 1 is a schematic representation of an example of a wireless network 100 including a core network 102 and a radio access network 104. The radio access network 104 may include a plurality of base stations $eNB_1$ to $eNB_5$, each serving a specific area surrounding the base station schematically represented by respective cells $106_1$ to $106_5$. The base stations are provided to serve users within a cell. A user may be a stationary device or a mobile device. Further, the wireless communication system may be accessed by mobile or stationary IoT devices which connect to a base station or to a user. The mobile devices or the IoT devices may include physical devices, ground based vehicles, such as robots or cars, aerial vehicles, such as manned or unmanned aerial vehicles (UAVs), the latter also referred to as drones, buildings and other items having embedded therein electronics, software, sensors, actuators, or the like as well as network connectivity that enable these devices to collect and exchange data across an existing network infrastructure. FIG. 1 shows an exemplary view of only five cells, however, the wireless communication system may include more such cells. FIG. 1 shows two users UE1 and UE2, also referred to as user equipment (UE), that are in cell $106_2$ and that are served by base station $eNB_2$. Another user $UE_3$ is shown in cell $106_4$ which is served by base station $eNB_4$. The arrows $108_1$, $108_2$ and $108_3$ schematically represent uplink/downlink connections for transmitting data from a user $UE_1$, $UE_2$ and $UE_3$ to the base stations $eNB_2$, $eNB_4$ or for transmitting data from the base stations $eNB_2$, $eNB_4$ to the users $UE_1$, $UE_2$, $UE_3$. Further, FIG. 1 shows two IoT devices $110_1$ and $110_2$ in cell $106_4$, which may be stationary or mobile devices. The IoT device $110_1$ accesses the wireless communication system via the base station $eNB_4$ to receive and transmit data as schematically represented by arrow $112_1$. The IoT device $110_2$ accesses the wireless communication system via the user $UE_3$ as is schematically represented by arrow $112_2$. The respective base station $eNB_1$ to $eNB_5$ are connected to the core network 102 via respective backhaul links $114_1$ to $114_5$, which are schematically represented in FIG. 1 by the arrows pointing to the "core". The core network 102 may be connected to one or more external networks.

For data transmission a physical resource grid may be used. The physical resource grid may comprise a set of resource elements to which various physical channels and physical signals are mapped. For example, the physical channels may include the physical downlink and uplink shared channels (PDSCH, PUSCH) carrying user specific data, also referred to as downlink and uplink payload data, the physical broadcast channel (PBCH) carrying for example a master information block (MIB) and a system information block (SIB), the physical downlink and uplink control channels (PDCCH, PUCCH) carrying for example the downlink control information (DCI), etc. For the uplink, the physical channels may further include the physical random access channel (PRACH or RACH) used by UEs for accessing the network once a UE synchronized and obtained the MIB and SIB. The physical signals may comprise reference signals (RS), synchronization signals and the like. The resource grid may comprise a frame having a certain duration in the time domain and a given bandwidth in the frequency domain. The frame may have a certain number of subframes of a predefined length. Each subframe may include slots of OFDM symbols.

The wireless communication system may operate, e.g., in accordance with the LTE-Advanced pro standard or the 5G or NR (New Radio) standard.

The wireless communication system may be any single-tone or multicarrier system based on frequency-division multiplexing, like the orthogonal frequency-division multiplexing (OFDM) system, the orthogonal frequency-division multiple access (OFDMA) system, or any other IFFT-based signal with or without CP, e.g., DFT-s-OFDM. Other waveforms, like non-orthogonal waveforms for multiple access, e.g., filter-bank multicarrier (FBMC), generalized frequency division multiplexing (GFDM) or universal filtered multi carrier (UFMC), may be used.

In wireless communication networks as described above with reference to FIG. 1, the uplink transmission may be scheduled by an access point (AP), like a base station, using a request-grant procedure, i.e., the mobile device or user sends a scheduling request (SR) to the AP during a registration procedure. Then the AP performs scheduling to grant resources to users in a centralized manner. The request-grant procedure, i.e., the initial association of a user to the wireless communication network is performed in a contention based manner. The same mechanism may be used to re-establish a connection between the user and the AP upon a connection failure. A conventional contention-based random access procedure may include four steps, and FIG. 2 is a signaling diagram for a successful contention-based random access procedure as it is described, e.g., in reference [1]. Initially a preamble is transmitted by the user, UE, to the access point, eNB. Upon detection of the preamble by the eNB, a random access response is transmitted followed by two further messages, the L2/L3 message from UE to the eNB and a message, if needed, for early contention resolution from the eNB to the UE. However, in case the eNB does not detect the preamble, a timeout occurs at the UE, and the UE transmits a further random access sequence of the same preamble format again.

In the presence of a massive number of devices sporadically accessing the system, the contention-based random access procedure may be associated with a sharp degradation in performance and large access delays, rendering the communication impractical. For example, currently implemented access mechanisms may not be capable of managing the access requests from hundreds or thousands of devices in a time-constraint system.

To address such drawbacks of conventional systems, access mechanisms in the physical (PHY) layer are discussed, on the basis of which the request-grant procedure, as explained above with reference to FIG. 2, may be omitted and user identities and user data may be transmitted to the access points simultaneously. For example, to accommodate an increasing number of user devices, access mechanisms in the physical layer may allow user devices to simultaneously transmit in a non-orthogonal manner information-bearing sequences over of a block of channel resources, like time-frequency resources. In such a context, the decoding at a receiver side is a demodulation of mutually interfering signals obtained by a superposition of the sequences transmitted by active user devices. The decoding may be implemented by employing compressed sensing (CS) based detection algorithms which benefit from the sparsity in the domain of active users.

In references [2] and [3] a dynamic compressed sensing based multi-user activity and data detection is described so as to realize both user activity and data detection in several continuous time slots. Temporal correlations of active user sets between adjacent time slots are used as prior information to estimate an active user set in the adjacent time slots. In reference [3] a similar joint user activity and data detection scheme for grant-free non-orthogonal multiple access is described which is based on approximate message passing and expectation maximization algorithms.

Although in such known approaches the average fidelity of the reconstruction, i.e., the detection, improves with the length of the information-bearing sequences, the cost of acquiring each additional sample, i.e., the need to reserve additional channel resource elements, is high when compared to the cost of computation. In addition, in the presence of variable channel conditions the average performance guarantees of CS-based detection algorithms do not translate to individual guarantees associated with the fidelity of reconstruction for the individual users. Thus, known approaches, like those mentioned in references [2], [3] and [4], do not enable an adaption of the transmission rates to individual channel conditions.

It is an object of the present invention to provide an approach improving the transmission of data by multiple of user devices over shared resources of a wireless communication network.

SUMMARY

According to an embodiment, a transmitter for transmitting data to a receiver of a wireless communication network may have: at least one antenna, a codebook including a plurality of codewords, each codeword being a vector including a plurality of symbols, each symbol to be transmitted over resources of the wireless communication network, an encoder configured to receive an information message to be transmitted to a receiver of the wireless communication network, to select from the codebook the codeword associated with the received information message, and to divide the selected codeword into a plurality of sub-codewords, and a transceiver coupled to the encoder and to the at least one antenna, the transceiver configured to transmit via the at least one antenna a first sub-codeword, and to transmit via the at least one antenna a second sub-codeword responsive to an indication that the encoded information message was not successfully decoded at the receiver on the basis of the received first sub-codeword.

According to another embodiment, a receiver for receiving data from a plurality of receivers of a wireless communication network, the wireless communication network including a plurality of resource elements, at least a subset of the plurality of resource elements shared by a plurality of transmitters for transmitting data from the plurality of transmitters to the receiver, may have: at least one antenna, a transceiver coupled to the at least one antenna, the transceiver configured to receive via the at least one antenna a receive signal on the subset of resource elements, wherein the receive signal includes sub-codewords associated with information messages to be transmitted by the respective receivers, each sub-codeword obtained by dividing, at the receiver, a codeword into a plurality of sub-codewords, and a decoder coupled to the transceiver, the decoder configured to obtain from the receive signal the plurality of sub-codewords, to determine, for each receiver, whether the information message transmitted by the receiver can be decoded successfully using the received sub-codeword associated with the receiver, and to decode an encoded information message from a receiver, in case decoding using the sub-codeword is possible.

According to another embodiment, a wireless communication network may have: a plurality of inventive transmitters as mentioned above, and an inventive receiver as mentioned above, wherein the signals from the plurality of transmitters are multiplexed and transmitted to the receiver over shared resources of the wireless communication network.

According to another embodiment, a method for transmitting data to a receiver of a wireless communication network may have the steps of: receiving an information message to be transmitted to a receiver of the wireless communication network, the codebook including a plurality of codewords, and each codeword being a vector including a plurality of symbols, each symbol to be transmitted over resources of the wireless communication network, selecting from the codebook the codeword associated with the received information, dividing the selected codeword into a plurality of sub-codewords, transmitting a first sub-codeword, and transmitting a second sub-codeword responsive to an indication that the encoded information message was not successfully decoded at the receiver on the basis of the received first sub-codeword.

According to still another embodiment, a method for receiving data from a plurality of receivers of a wireless communication network, the wireless communication network including a plurality of resource elements, at least a subset of the plurality of resource elements shared by a plurality of transmitters for transmitting data from the plurality of transmitters to the receiver, may have the steps of: receiving a receive signal on the subset of resource elements, wherein the receive signal includes sub-codewords associated with information messages to be transmitted by the respective receivers, each sub-codeword obtained by dividing, at the receiver, a codeword into a plurality of sub-codewords, obtaining from the receive signal the plurality of sub-codewords, determining, for each receiver, whether the information message transmitted by the receiver can be decoded successfully using the received sub-codeword associated with the receiver, and decoding an encoded information message from a receiver, in case decoding using the sub-codeword is possible.

Another embodiment may have a non-transitory digital storage medium having stored thereon a computer program for performing a method for transmitting data to a receiver of a wireless communication network having the steps of: receiving an information message to be transmitted to a receiver of the wireless communication network, the codebook including a plurality of codewords, and each codeword being a vector including a plurality of symbols, each symbol to be transmitted over resources of the wireless communication network, selecting from the codebook the codeword associated with the received information, dividing the selected codeword into a plurality of sub-codewords, transmitting a first sub-codeword, and transmitting a second sub-codeword responsive to an indication that the encoded information message was not successfully decoded at the receiver on the basis of the received first sub-codeword, when said computer program is run by a computer.

Still another embodiment may have a non-transitory digital storage medium having stored thereon a computer program for performing a method for receiving data from a plurality of receivers of a wireless communication network, the wireless communication network including a plurality of resource elements, at least a subset of the plurality of resource elements shared by a plurality of transmitters for transmitting data from the plurality of transmitters to the receiver, the method having the steps of: receiving a receive signal on the subset of resource elements, wherein the receive signal includes sub-codewords associated with information messages to be transmitted by the respective receivers, each sub-codeword obtained by dividing, at the receiver, a codeword into a plurality of sub-codewords, obtaining from the receive signal the plurality of sub-codewords, determining, for each receiver, whether the information message transmitted by the receiver can be decoded successfully using the received sub-codeword associated with the receiver, and decoding an encoded information message from a receiver, in case decoding using the sub-codeword is possible, when said computer program is run by a computer.

BRIEF DESCRIPTION OF THE DRAWINGS

Embodiments of the present invention are now described in further detail with reference to the accompanying drawings, which include or show variables which will be explained in the detailed description of the drawings. In the drawings.

DETAILED DESCRIPTION OF THE INVENTION

Figure 1:
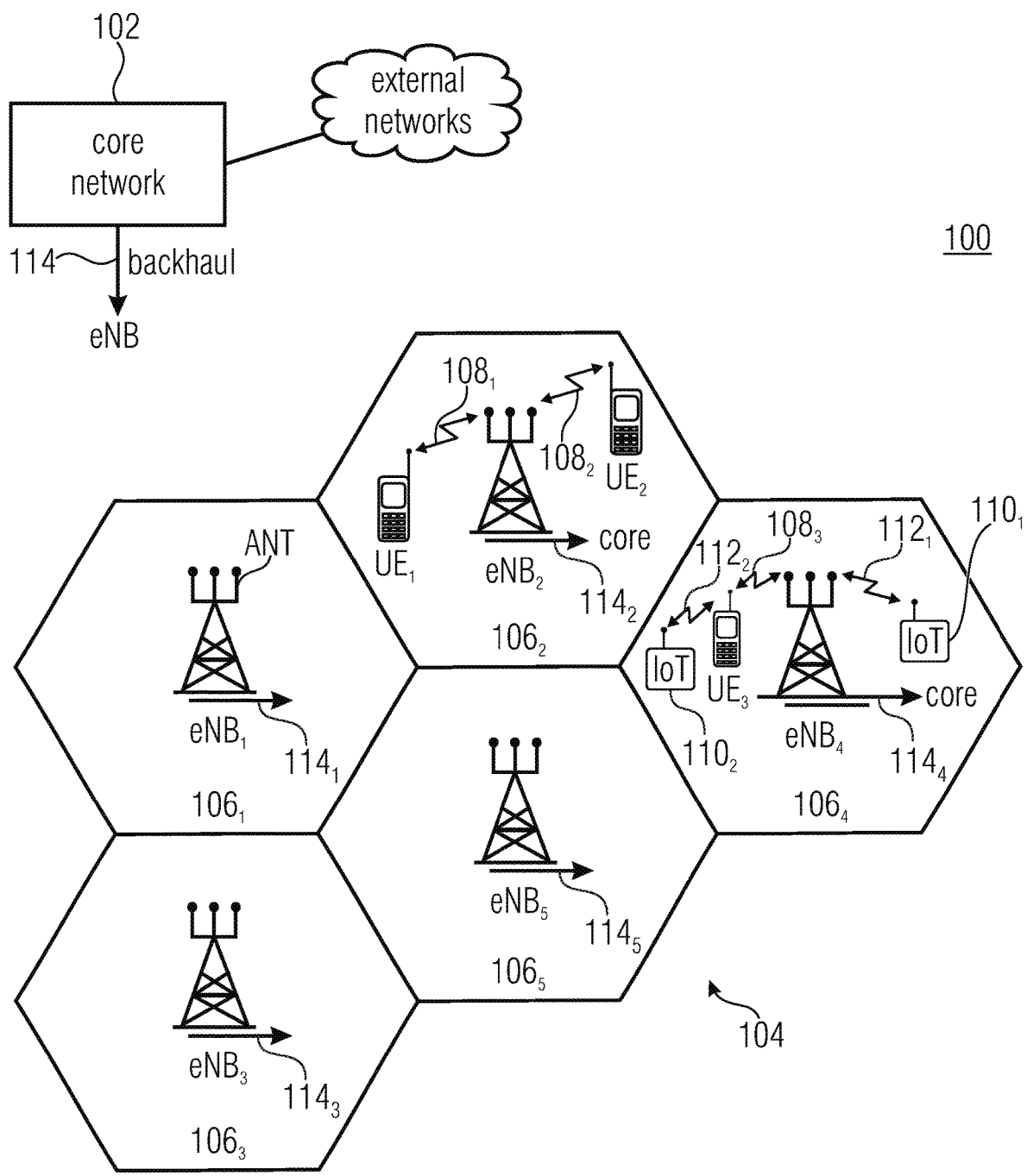
FIG. 1 shows a schematic representation of an example of a wireless communication system.
Figure 2:
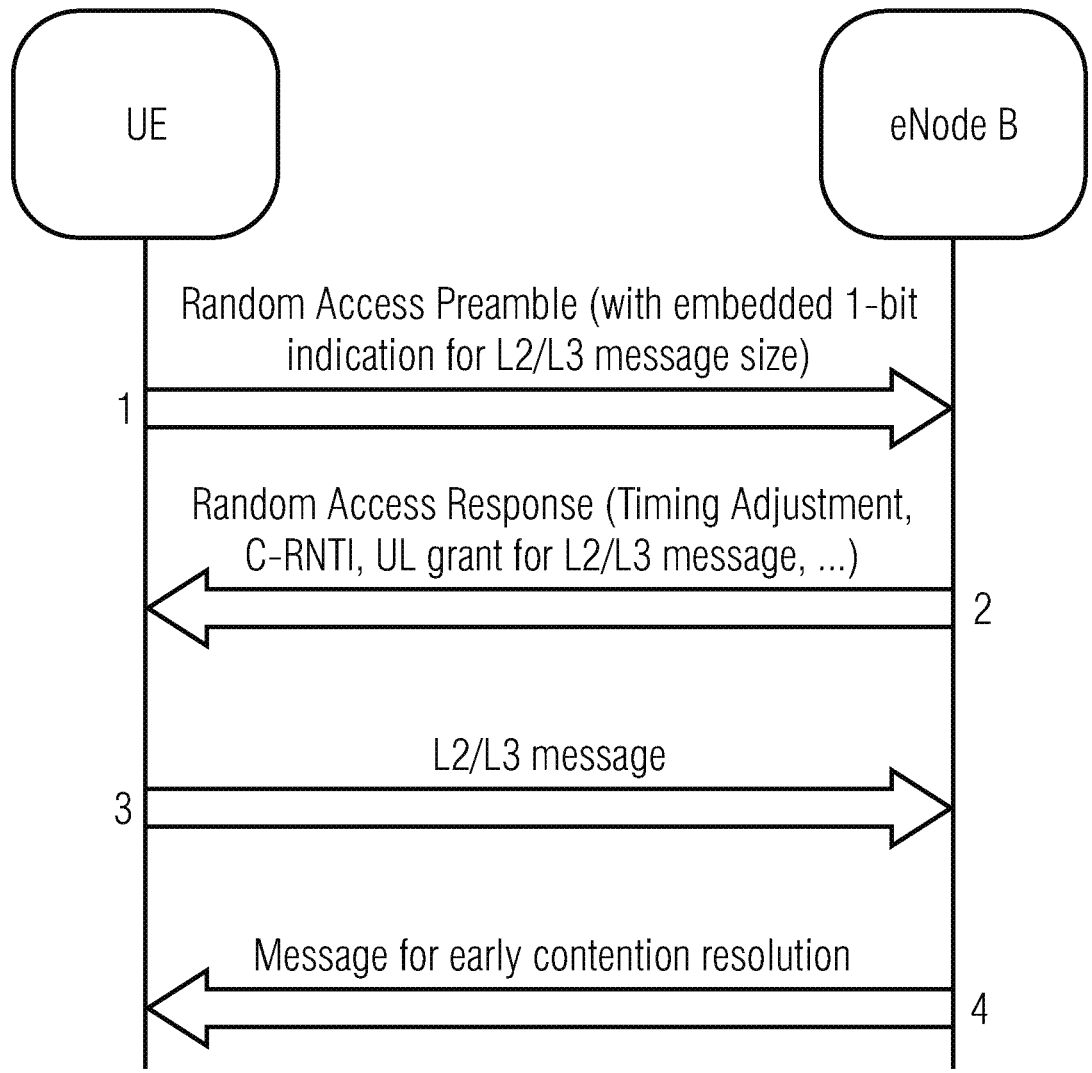
FIG. 2 is a signaling diagram for a successful contention-based random access procedure.

In the following, embodiments of the present invention are described in further detail with reference to the enclosed drawings in which elements having the same or similar function are referenced by the same reference signs.

Embodiments of the present invention provide a transmitter for transmitting data to a receiver of a wireless communication network. The transmitter includes at least one antenna, a codebook, an encoder and a transceiver coupled to the encoder and to the at least one antenna. The codebook includes a plurality of codewords, each codeword being a vector including a plurality of symbols, each symbol to be transmitted over resources of the wireless communication network. The encoder is configured to receive an information message to be transmitted to a receiver (BS) of the wireless communication network, to select from the codebook the codeword associated with the received information message, and to divide the selected codeword into a plurality of sub-codewords. The transceiver is configured to transmit via the at least one antenna a first sub-codeword, and to transmit via the at least one antenna a second sub-codeword responsive to an indication that the encoded information message was not successfully decoded at the receiver (BS) on the basis of the received first sub-codeword.

In accordance with embodiments, each codeword of the codebook may have associated therewith an index, wherein an information message received is mapped to an index of a codeword in the codebook, and wherein the encoder is configured to select from the codebook the codeword having associated therewith the index to which the received information message is mapped. In accordance with other embodiments the vector may be formed of at least one vector selected from a unique set of vectors, the unique set of vectors exclusively assigned to the transmitter.

Embodiments of the present invention provide a receiver for receiving data from a plurality of receivers of a wireless communication network. The wireless communication network includes a plurality of resource elements, and at least a subset of the plurality of resource elements is shared by a plurality of transmitters for transmitting data from the plurality of transmitters to the receiver. The receiver includes at least one antenna, a transceiver coupled to the at least one antenna and a decoder coupled to the transceiver. The transceiver is configured to receive via the at least one antenna a receive signal on the subset of resource elements, wherein the receive signal includes sub-codewords associated with information messages to be transmitted by the respective receivers (BS), each sub-codeword obtained by dividing, at the receiver, a codeword into a plurality of sub-codewords. The decoder is configured to obtain from the receive signal the plurality of sub-codewords, to determine, for each receiver, whether the information message transmitted by the receiver can be decoded successfully using the received sub-codeword associated with the receiver, and to decode an encoded information message from a receiver, in case decoding using the sub-codeword is possible.

Embodiments of the present invention address the challenging requirements for a wireless communication, like a 5G wireless communication, e.g., due to the increasing demand of mobile internet and the Internet-of-Things (IoT). Such challenges may include the delivery of massive connectivity with certain reliability and certain latency guarantees. For example, the massive random paradigm is characterized by a huge number of user devices accessing sporadically the wireless channel to transmit data. A contention-free orthogonal multiple access protocol, such as TDMA, (O)FDMA and the like, may not meet such requirements due to the fact the resources are usually assigned to the users in a fixed and centralized manner. This, inevitably, results in a large signaling overhead, in a high realization complexity and a low overall system efficiency. Contention-based mechanisms, such as ALOHA/slotted ALOHA, on the other hand, suffer from throughput degradation in the presence of a large number of users due to the delay associated with the back off/retransmission mechanisms implemented. In view of spectral constraints in the wireless communication networks, radio access techniques may be provided allowing user devices to share the wireless resources in a non-orthogonal fashion, either at the initial access phase or at the data transmission phase, or in both phases, for example when implementing a joint initial access plus data transmissions scheme. Examples for such schemes include the concept of non-orthogonal multiple-access (NOMA) which relies on power-domain or code-domain multiplexing, with corresponding schemes including power domain NOMA, multiple access with low-density spreading, sparse code multiple access, multi-user shared access, pattern division multiple access, and the like. Another example, are communication schemes allowing user devices to simultaneously perform initial access and to communicate information to a joint receiver by transmitting non-orthogonal information-bearing sequences over a block of shared channel resources, like time-frequency slots.

In each of the above given examples allowing for a concurrent non-orthogonal transmission, the decoding problem becomes one of a multi-user detection, i.e., of a demodulation of mutually interfering signals obtained by a superposition of the signal vectors or sequences transmitted by the active users. In cases, in which at any time instant the number of active users is typically small, multiuser detection may be performed by employing compressed sensing (CS) based detection algorithms which benefit from the sparsity in the user domain. In the compressed sensing terminology, the length of the transmitted sequences correspond to the number of random linear measurements of a signal, and then signal is recovered using the additional knowledge that the received signal is sparse in the dictionary holding the UE sequences.

As mentioned above, while the average fidelity of the reconstruction or detection improves with the number of available samples, i.e., the length of information-bearing sequences, the cost of acquiring each additional sample, for example, by reserving additional channel resource elements, is high when compared to the cost of computation. In addition, in the presence of variable channel conditions, the average performance guarantees of CS-based detection algorithms do not translate to individual guarantees associated with the fidelity of reconstruction for the individual users.

To address the above issues, the inventive approach teaches a communication scheme in which, in accordance with embodiments, the user devices may adjust the individual lengths of the transmission-bearing sequences so as to maximize the probability of success detection, for example, the detection of user activity and the detection of data, at a joint receiver. The adaption may employ feedback from the joint receiver to the individual user device, the feedback providing, for example, information associated with the assessed likelihood of a successful detection as seen at the receiver. The resulting scheme efficiently operates in a rateless fashion, with the individual communication rates being determined by the combination of multi-user detection and receiver feedback. Thus, embodiments of the inventive approach provide a flexible multiple access solution that delivers performance guarantees by a seamless adaption of the UE transmit data rates to the channel conditions. In accordance with embodiments, algorithms implemented at the receiver side may be based on message passing, for example belief propagation (BP), and extensions therein, such as approximate message passing and generalized approximate message passing.

In accordance with the inventive approach, the detection algorithm may operate in an online fashion, i.e., it may work on sequential receive batches which may have sizes depending on the frequency of feedback. Thus, embodiments of the inventive approach provide a communication scheme allowing for implementing a random access and multiple access technology, as it may be used in 5G/new radio. Embodiments of the inventive approach may (i) improve the throughput of a wireless network and enable, for example, uplink, downlink, device-to-device or machine-to-machine transmissions (UL, DL, D2D, M2M) transmissions;
(ii) deliver performance guarantees to individual users in terms of throughput, reliability and latency;
(iii) accommodate a large number of system devices or user devices;
(iv) decrease latency in a random access scenario by joint user identification and data transmission;
(v) provide a non-coherent data transmission, for example without instantaneous transmit/receive channel knowledge;
(vi) transmit short packages with a small overhead;
(vii) provide a low-complexity receiver implementation based on approximate message passing; and
(viii) provide an EXIT chart-based evaluation methodology.

Embodiments of the inventive approach may be implemented in all kinds of wireless communication networks, such as current and upcoming 3GPP releases, in which large numbers of devices are accessing the system to communicate relatively small amounts of data.

In accordance with the inventive approach, observations, like samples, available at the receiver in sequence are employed to perform computations in between the observations to decide whether enough samples have been obtained so as to allow the recovery of a received signal either exactly or to a given tolerance from the smallest possible number of observations. Implementing this scheme allows user devices to stop transmissions as soon as there is reasonable certainty of either exact or sufficiently accurate reconstruction at the receiver side. This mechanism may provide a way to obtain run-time guarantees for the recovery methods that otherwise lack a-priori performance bounds.

Figure 3:
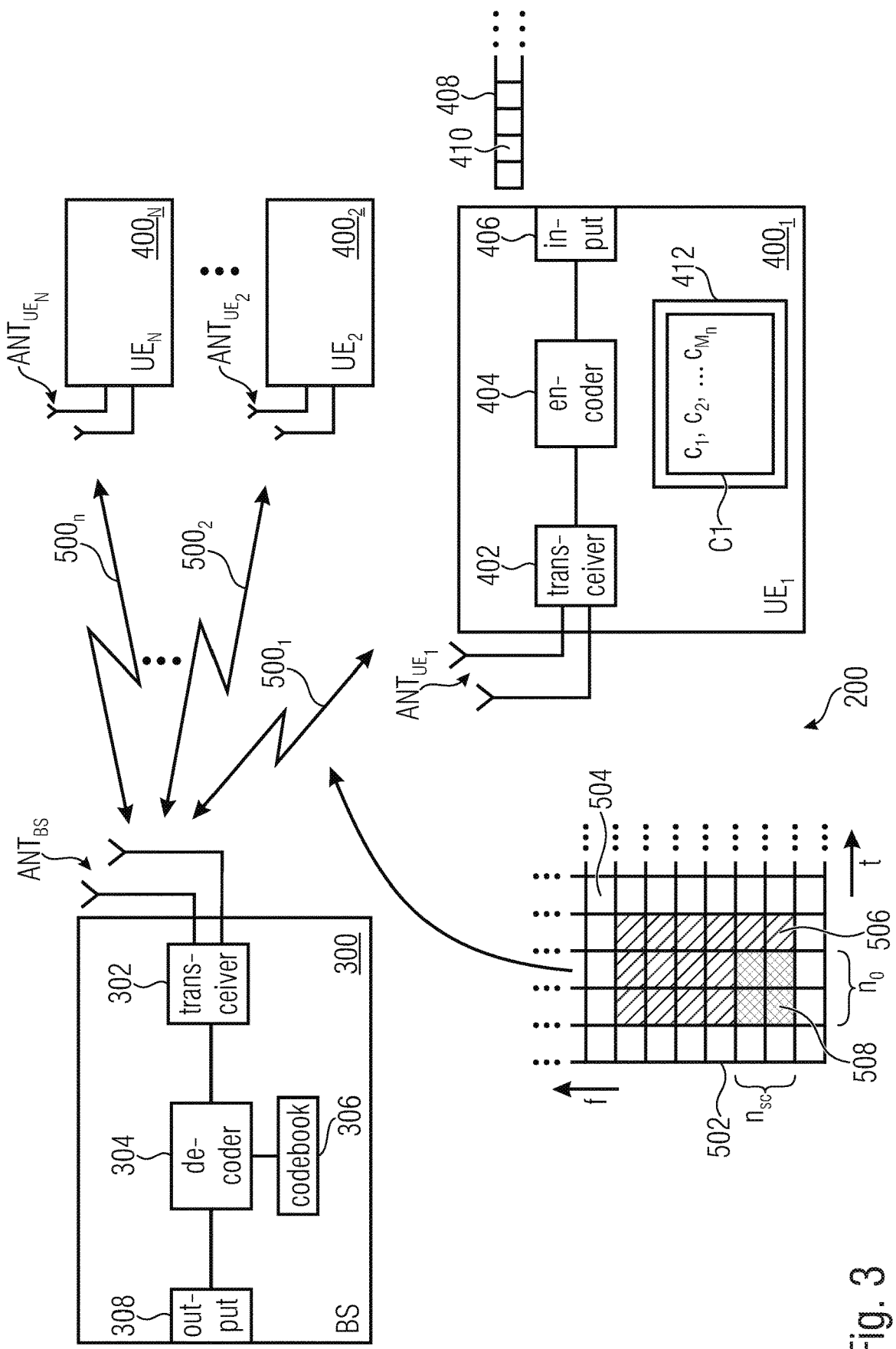
FIG. 3 is a schematic representation of a wireless communication system for transmitting information between a transmitter to a receiver in accordance with an embodiment of the present invention.

Embodiments of the present invention may be implemented in a wireless communication system as depicted in FIG. 1 including base stations, users, like mobile terminals or IoT devices. FIG. 3 is a schematic representation of a wireless communication system 200 for communicating information between a base station 300 and a plurality of UEs $400_1$-$400_N$ and operating in accordance with embodiments of the inventive approach described herein. As is schematically indicated by the arrows $500_1$-$500_N$ signals are communicated between the base station 300 and the UEs $400_1$-$400_N$ via a wireless communication link, like a radio link. For transmitting data or information, the wireless communication system 200 may use a physical resource grid 502 as described above and as it is used, e.g. in an OFDM-based system. The physical resource grid may comprise resource elements 504 to which physical signals may be mapped. The physical resource grid may comprise a frame having a certain duration, like 10 milliseconds, in the time domain and having a given bandwidth in the frequency domain. The frame may have a certain number of subframes of a predefined length. Each subframe may include two slots of 6 or 7 OFDM symbols. In accordance with embodiments, within the physical resource grid provided by the wireless communication system 200 for the data communication, like a LTE system, a subset 506 of the resource elements 504 may be used for the data communication among the BS and the UEs. The resource elements 504, more generally the resources assigned for implementing massive random access scheme are known by the base station 300 and the UEs $400_1$-$400_N$.

In accordance with other embodiments, the wireless communication system 200 may be for exclusively serving UEs, e.g., sensor networks or networks linking machines in a factory. Such a wireless communication system 200 may operate on dedicated resources and all of the resources of such a system 504 may be used for the data communication among the BS and the UEs.

The base station 300 includes the one or more antennas $ANT_{TX}$, a transceiver 302 coupled to the one or more antennas $ANT_{TX}$ and a decoder 304 coupled to the transceiver 302. The transceiver 302 receives via the one or more antennas $ANT_{TX}$ a receive signal on the subset 506 of resource elements 504. The decoder 304 obtains from the receive signal the codewords representing data elements associated with the respective UEs for decoding. The base station 300, in accordance with embodiments, may include a storage device 306, like a memory, which stores a codebook including a plurality of codewords, like vectors including a plurality of symbols to be transmitted over the resources of the wireless communication network. The decoded data elements may be provided to an output 308.

The UE $400_1$ includes one or more antennas $ANT_{UE}$, a transceiver 402 coupled to the one or more antennas $ANT_{UE}$, an encoder 404 and an input 406. At the input 406 the UE $400_1$ receives a data stream 408 which may include a plurality of data elements 410 to be transmitted from the UE $400_1$ to the base station 300. The encoder 404 receives the data element $410_1$ and maps it to a codeword. The UE $400_1$, in accordance with embodiments, may include a storage device 412, like a memory, which stores a codebook $C_1$ including a plurality of codewords $c_1, \ldots, c_{M_1}$. Responsive to the data elements $410_1$ to be encoded, the encoder 404 selects codeword representing the data elements or data to be transmitted. The transceiver 402 is coupled to the encoder 404 and to the one or more antennas $ANT_{UE}$ to transmit via the one or more antennas $ANT_{UE}$ the codeword on the subset 504 of resource elements 502. For example, when active, each UE $400_1$-$400_n$ transmits its vector of complex symbols over a resource block (RB) 508 including $n_{RB}$ resource elements (REs) 504, which may be time-frequency slots. For example, in an OFDM-based system, the RB 508 may include $n_o$ OFDM symbols in the time domain, each symbol spanning $n_{sc}$ subcarriers in the frequency domain. Hence the RB 508 includes a total of $n_{RB}=n_o \cdot n_{sc}$ resource elements, where $n_o$ is related to the RB duration, and $n_{sc}$ is related to the associated bandwidth.

It is noted that the remaining UEs $400_2$-$400_N$ may have the same or a similar structure and operate in the same or in a similar way as UE $400_1$. Further, the UEs $400_1$-$400_N$ may simultaneously perform an initial access and communicate information to the base station 300.

In accordance with embodiments of the present invention, when implemented in a system as described with reference to FIG. 3, an active UE, for example $UE_1$ is controlled to transmit information over the shared resource element in a sequential fashion, for example by transmitting one OFDM symbols spanning over $n_{sc}$ subcarriers at a time, as shall be described with reference to further embodiments in more detail below. For example, in accordance with embodiments the codeword may be split into a plurality of sub-codewords and, initially, a first sub-codeword is transmitted. One or more further sub-codewords are transmitted dependent on an expected success of a decoding process at the receiver based only on the first sub-codeword so that, for example, in case the receiver is likely to correctly decode the data element based only on the received sub-codeword, no further transmission of the remaining sub-codewords is required. In case the feedback indicates that it is not likely that the codeword can be correctly decoded on the basis of only one or more of the sub-codewords received so far, further sub-codewords may be transmitted at a subsequent time, i.e., sequential to the already transmitted one or more sub-codewords.

A system, as it is depicted in FIG. 3, may include N UEs in total, where the n-th UE selects codewords from a predefined codebook $C_n=\{c_1, \ldots, c_{M_n}\}$ of size $M_n$ to convey information to the common receiver BS. The codewords, in accordance with embodiments, may be vectors or sequences of complex symbols having a length K, wherein the symbols are transmitted over the communication channel resource elements which, in general, are shared among the N UEs.

In accordance with embodiments of the present invention, when implemented in a system as described with reference to FIG. 3, an active UE, for example $UE_1$ is controlled to transmit information over the shared resource element in a sequential fashion, for example by transmitting one OFDM symbols spanning over $n_{sc}$ subcarriers at a time, as shall be described with reference to further embodiments in more detail below. For example, in accordance with embodiments the codeword may be split into a plurality of sub-codewords and, initially, a first sub-codeword is transmitted. One or more further sub-codewords are transmitted dependent on an expected success of a decoding process at the receiver based only on the first sub-codeword so that, for example, in case the receiver is likely to correctly decode the data element based only on the received sub-codeword, no further transmission of the remaining sub-codewords is required. In case the feedback indicates that it is not likely that the codeword can be correctly decoded on the basis of only one or more of the sub-codewords received so far, further sub-codewords may be transmitted at a subsequent time, i.e., sequential to the already transmitted one or more sub-codewords. In accordance with embodiments, one form of feedback is sending an acknowledgment only to the UEs for which the decoding was successful. However, in accordance with other embodiments other feedback schemes or possibilities may be used, e.g. a negative acknowledgment. In accordance with further embodiments, the efficiency of the feedback may depend on the probability of user activation.

A system, as it is depicted in FIG. 3, may include N UEs in total, where the n-th UE selects codewords from a predefined codebook $C_n$ to convey information to the common receiver BS. The codewords, in accordance with embodiments, may be vectors or sequences of complex symbols having a length K, wherein the symbols are transmitted over the communication channel resource elements which, in general, are shared among the N UEs.

Assuming a matrix C being a $K\times(M_1+M_2+ \ldots +M_N)$ matrix, $C=[C^*_1, C^*_2, \ldots, C^*_N]$, where the matrices $C^*_1, C^*_2, \ldots, C^*_N$ stack the codewords of $C_1, C_2, \ldots, C_N$ respectively, for example horizontally, in accordance with embodiments, the information message or data of user n is mapped to the index of a codeword, where the index is in the range from 1 to $M_n$. In this way, each transmitted codeword from the codebook $C_n$ carries $\log_2 M_n$ information bits. By transmitting a codeword of the length K, the UE addresses K channel resource elements which gives an effective communication rate of $$\frac{\log_2 M_n}{K}$$

bits per channel use or resource element.

Figure 4:
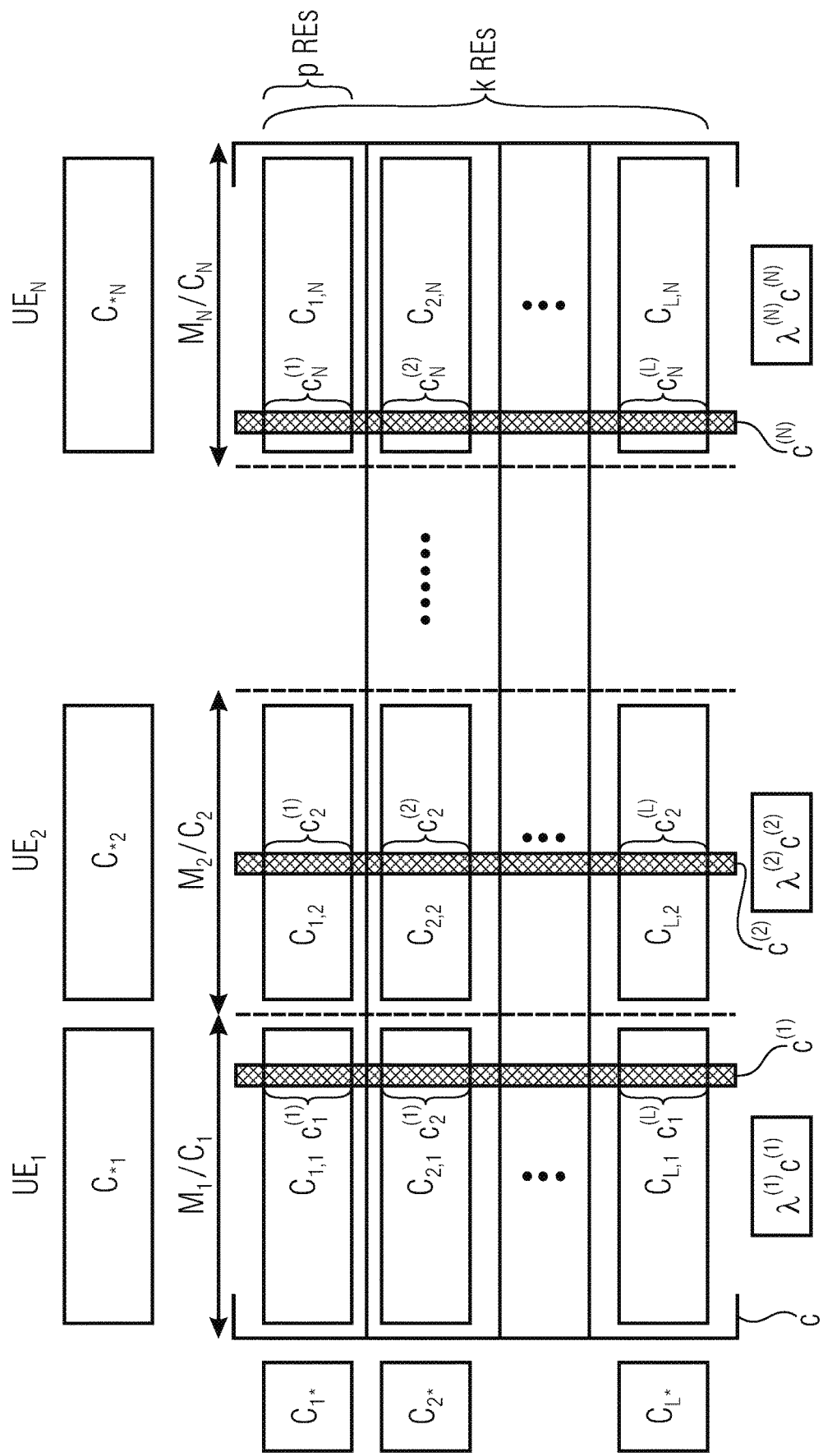
FIG. 4. illustrates a block structure of a multi-user encoding process in accordance with embodiments of the present invention.

In accordance with the inventive approach, the drawbacks in the known approaches are addressed from a perspective of compressed sensing where the transmitted codeword symbols correspond to samples, also referred to as observations, based on which the receiver may infer the transmitted message and associated user. Typically, the fidelity of the decoding process performed at the receiver depends on the number of observations, for example the codeword length, with larger codeword lengths effectively providing better reliability of the coding process. However, in accordance with the inventive approach, it has been found by the inventors of the present invention that, e.g., under favorable channel conditions, even fewer observations, i.e., fewer samples may be sufficient for a successful decoding process at the receiver, meaning that less than K symbols need to be transmitted at a time over the available resource elements. In accordance with the inventive approach, a communication scheme is provided where the codewords of each user are divided into L blocks (also referred to as sub-codewords) of corresponding lengths $P_1, P_2, \ldots$, such that $P_1 + P_2 + \ldots + P_L = K$. The sub-codewords are to be transmitted over the communication channel in a sequential fashion. FIG. 4 illustrates a block structure of a multi-user encoding process in accordance with embodiments of the present invention. $c^{(n)}$ denotes an information-bearing codeword of the UE n, e.g, a vector having the length K. As an example, when the length of each sub-codeword is the same, $P_1 = P_2 = \ldots P_L = P$, where K=LP and L≥1 is an integer, $c^{(n)}$ may be written as $c^{(n)} = [c_1^{(n)}, c_2^{(n)}, \ldots, c_L^{(n)}]$, where the P-dimensional vectors $c_1^{(n)}, c_2^{(n)}, \ldots, c_L^{(n)}$ are stacked vertically to build the vector $c^{(n)}$ having a length K. FIG. 4, schematically, represents the $K \times (M_1 + M_2 + \ldots + M_N)$ matrix C which includes all codebooks/codewords of the system using the N users for a communication to the base station, for example the system of FIG. 3. Each of the columns $C^*_1, C^*_2, \ldots, C^*_N$ of the matrix C represents codebooks for the respective user devices $UE_1, UE_2, \ldots UE_N$. The vertical black bars in FIG. 4 schematically represent the respective codewords $c^{(1)}, c^{(2)} \ldots c^{(N)}$ selected by the respective users at a specific instance for a transmission of data encoded by the respective codewords to the base station over the shared resources. The choice of the sub-codeword lengths $P_1, P_2, \ldots, P_L$ are parameters that are to be adjusted according to the expected performance of the decoding algorithm, which may also depend on the channel conditions and the probability of user activation, and to the frequency of feedback provided from the receiver to the transmitters.

In accordance with the inventive approach, when assuming a frame based system with a synchronization on a slot basis, in a first phase of the transmission process, a UE n transmits a first sequence of symbols $c_1^{(n)}$, which is a sub-vector of the codeword $c^{(n)}$ including the first P elements of the codeword or vector $c^{(n)}$. In the example of FIG. 4, $UE_1$ transmits initially the sequence $c_1^{(1)}$ and, likewise, the remaining UEs transmit the first parts of the vectors or the sub-vectors of the respective codewords $c^{(2)}, \ldots, c^{(N)}$. Assuming that the channel covariance bandwidth is larger than P, the received signal at the common receiver BS may be represented as a function of the linear mixture:

$$ny_1 = f(\Sigma_{n=1}^N \lambda^{(n)} h^{(n)} c_1^{(n)} + W_1),$$

where the scalar $\lambda^{(n)} \in \{0,1\}$ denotes user activity ($\lambda^{(n)} = 1$ when UE n is active and $\lambda^{(n)} = 0$ when it is not active in the addressed frame), the scalar $h_n$ represents the unknown channel coefficients between UE n and the receiver, and $w_1$ is an additive noise vector. In accordance with examples, in case UE n is inactive, it may be considered as transmitting an all-zero sequence, which may be considered at the receiver as a separate codeword which appears with a probability determined by the UEs traffic/activation pattern. The function f (°) accounts for possible nonlinearities such as those due to quantization or the like.

The traffic/activation pattern may indicate a probability of activation of a UE during a predefined time period, for example during the frame. The activation pattern may be known at the BS and may be exploited during the demapping process. The BS may access codewords associated only with active users according the probabilities of activation of the transmitters, for example starting with the highest probability. This embodiment is advantageous as the BS will start with the demapping for those UEs that are most likely to send data during a current frame, thereby improving the processing the received signal and expediting the decoding processes. The traffic/activation pattern may be represented by individual probabilities $p_1 \ldots p_N$ of activation, within one frame, of each of the NUEs.

In accordance with other embodiments, the received signal, during the first phase of transmission, may be written as $$y_1 = f(C_1^* x_1 + w_1),$$

where $C_1^*$ (see FIG. 4) is the $P \times (M_1 + M_2 + \ldots + M_N)$ sub-matrix of C containing the first P rows of C. With this representation, the block-sparse vector $x_1$ having a length K captures the joint information about the set of active users, the indices of the selected codewords of the corresponding active users, and the respective channel realizations. Having received the vector $y_1$ including the first P samples or observations, the receiver, like base station BS in FIG. 3, performs a reconstruction of $x_1$, like a compressive-sensing base reconstruction, that accounts for the nature of the transmitted sequences and for the sparsity in the UE activation pattern. As the information conveyed by the active UEs is contained in the support of the vector $x_1^{(n)}$, an explicit knowledge of the channel realization is not necessary in order for the receiver to detect the active users and their respective data, meaning that there is no explicit channel estimation required in accordance with embodiments of the inventive approach.

In accordance with the inventive approach the receiver computes an estimate of the fidelity of the reconstruction at different stages of the decoding process. For example, the decoding process may include the calculation of log-likelihood ratios associated with the reconstructed, i.e., detected code words. For example, low-complexity detection schemes based on an approximate interference technique may be implemented, such as an approximate message passing, or extensions in the form of generalized approximate message passing, in the case where the observations are obtained after a non-linear operation, for example a quantization, on the received signal.

The Coding Process may be as Follows:

In a first phase, based on the received vector $y_1$ including the first P observations, the decoder at the receiver BS returns the log-likelihood ratios (LLRs) associated with the activity of the individual users $UE_1$ to $UE_N$:

$$LLR_\lambda^{(n)} = \frac{\log(p(\lambda^{(n)} = 1 \mid y_1))}{\log(p(\lambda^{(n)} = 0 \mid y_1))}$$

Together with the LLRs associated with the transmitted code words, for example the code indices, of the active users $$LLR_c^{(n)} = \frac{\log(p(c^{(n)} = c \mid y_1))}{\log(p(c^{(n)} \neq c \mid y_1))}.$$

The decoder selects two thresholds, $t_\lambda$ and $t_c$, and feeds back acknowledgments to the UEs for which $LLR_\lambda^{(n)} > t_\lambda$ and $LL_c^{(n)} > t_c$.

In case the decoding of a data message based on the received sub-codeword is likely, an acknowledgment will be send from the BS to the respective UE.

In a second phase, only those active UEs, which did not receive an acknowledgment after the first phase, continue with their respective transmissions. For example, if UE n is active, but has not received an acknowledgment from the receiver, in the second phase it will transmit the second sequence of symbols $c_{2(n)}$, which is a further sub-vector of $c^{(n)}$, including the second block of P elements of $c^{(n)}$, as is also illustrated in FIG. 4. The receiver will perform the same decoding procedure as in the first phase with the difference that it now has the side information about the active users decoded of the first phase of the decoding process which simplifies the decoding in this phase. Again the decoder outputs the LLRs associated with the UE activity and their respective messages and feeds back acknowledgments in case the thresholds are exceeded. The thresholds, in accordance with embodiments, may be computed offline and may differ between the decoding phases. The decoding procedure continues until all UE messages are detected or the codeword lengths K is reached, i.e., after a maximum of L=K/P transmission phases.

In this way, the transmission scheme, in combination with the receiver architecture, may provide a rateless operation over the random access/multiple access channel, where the rate is effectively determined by the receiver during a decoding procedure that allows to recover the signal either exactly or to a given tolerance from the smallest possible number of observations/received symbols which provides for a mechanism to obtain run-time guarantees for recovery methods that otherwise lack a-priori performance bounds.

In accordance with embodiments, during the second phase UEs which received the acknowledgement may transmit new sub-codewords representing new messages or new data, while those UE transmit additional sub-codewords representing the current message, the message that was not decodable at the receiver using the previously received sub-codeword(s).

In accordance with embodiments, the inventive scheme may uniquely identify user devices, like the n-th UE by a predefined codebook $C_n$ of the size $M_n$ which entails that the information about $C_n$, n=1, ..., N, is communicated to all system users, for example when setting up the system or when one of the users accesses the system, i.e., it is a one-time procedure. In accordance with embodiments, the matrix C, i.e. the codebooks $C_n$, n=1, ..., N, may be generated according to a pre-defined procedure known to the transceivers, for example from a seed vector or a frame (in mathematical sense). This may decrease both the amount of information that has to be exchanged within the system, as well as the storage (memory) requirements. Basically, the inventive approach is independent from the codebook design, nevertheless, in accordance with embodiments, the decoding may rely on a signal reconstruction based on the compressive sensing, so that the fidelity of the reconstruction process depends on the choice of the UE codebooks $C_n$, i.e., on the properties of the matrix C.

In the embodiments described above, it has been mentioned that the respective codewords $C^{(n)}$ are split into a plurality of blocks that are transmitted in a sequential fashion wherein the blocks have the same size. However, in accordance with other embodiments, the blocks may have different sizes, dependent on the implementation. For example, the block size may increase so that any transmission following an earlier transmission provides more information and thereby increases the likelihood that the codeword can be successfully decoded. In accordance with other embodiments, a higher number of symbols may be transmitted initially followed by a number of transmitted symbols that is decreasing so as to provide, initially, a higher probability of successfully decoding the codeword, and in case it is not possible, small amounts of additional data is sent to enhance the probability of the decoding process.

Embodiments of the present invention may be implemented using a code as described in European patent application 17184100.0, "TRANSMISSION OF DATA BY MULTIPLE USERS OVER SHARED RESOURCES BASED ON STRUCTURED SUPERPOSITION CODING", filed on Jul. 31, 2017, which is hereby incorporated by reference. A user device may store a unique set A of K-dimensional vectors (K is the number of resource elements at disposal) $a_1, \ldots, a_M$ exclusively assigned to the user device. Responsive to the data elements to be encoded, at least one vector is selected from the unique set A of vectors to obtain the codeword c representing the data elements or data to be transmitted. The information carried by the codeword c is contained in the choice of the vectors to be linearly combined into a subset of the vectors from the set A, rather than the elements (i.e. the entries) of the resulting K-dimensional signal vector or codeword c. By directly encoding the data to a linear combination of multi-dimensional vectors, an explicit symbol mapping as in conventional RF digital modulation is circumvented. As the design of the sequence $a_1, \ldots, a_M$ is left unspecified, it is also not excluded that the individual vector elements are built from a finite-dimensional constellation resembling RF digital modulation such as QPSK (four possible symbol states), 16-QAM (16 symbols states), or 64-QAM (64 symbols states). The codeword formed of the one or more vectors $a_1, \ldots, a_M$ not only represents the data element, but may also identify the user device at a base station, because the unique set A of vectors is exclusively assigned to the user device. In other words, a base station receiving codewords formed of vectors may distinguish and identify the user devices as each of the user devices uses one or more vectors that are used exclusively (only) by the respective user device, i.e., there is no vector that is used by two or more user devices.

Figure 5:
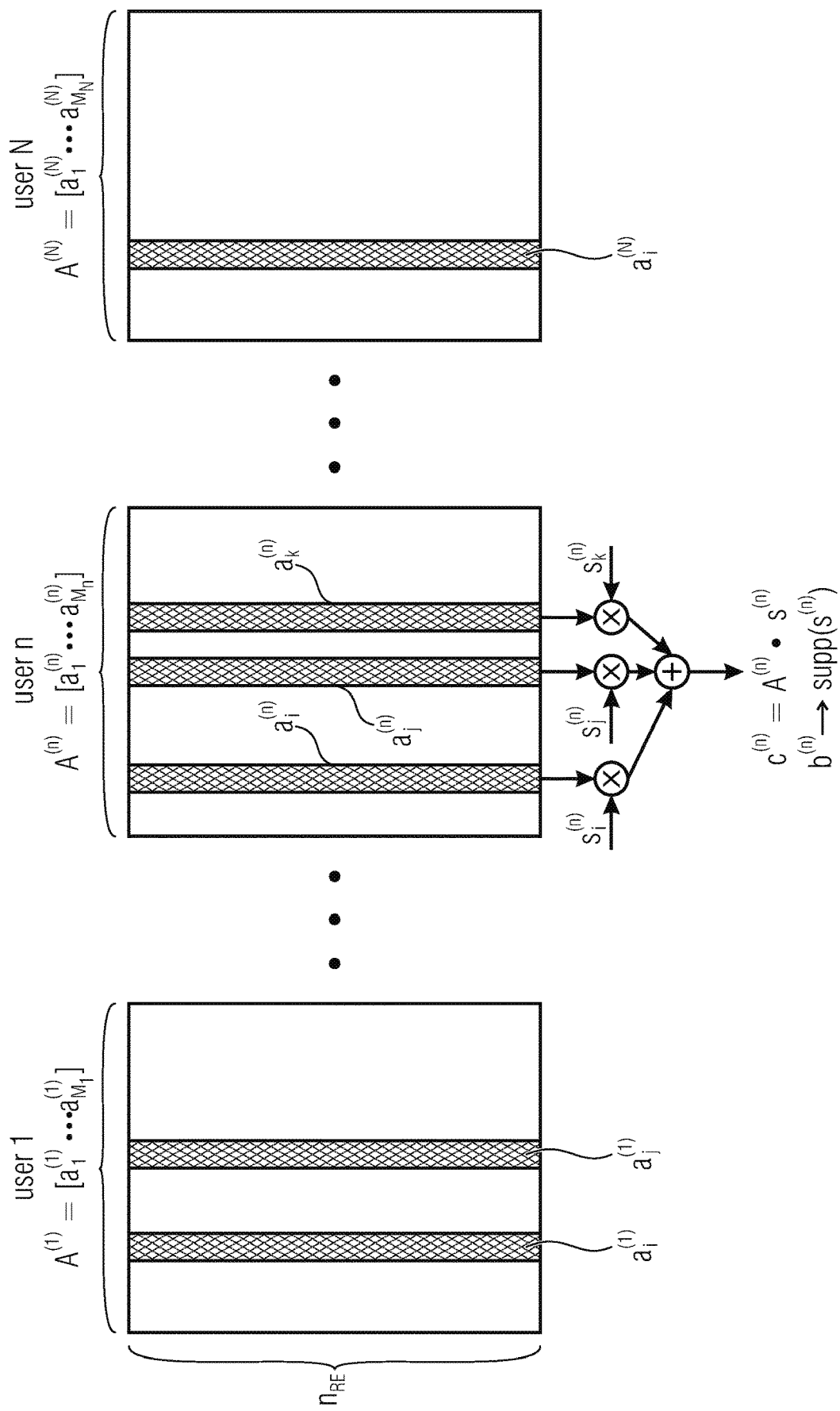
FIG. 5 illustrates an example of an encoding process mapping a binary information message to a codeword in accordance with embodiments.

In accordance with an embodiment, in a system in which N user devices, the $n^{th}$ user device or UE encodes information by linearly combining vectors from the unique set of vectors, which may be represented as $A^{(n)} = \{a_1^{(n)}, \ldots, a_{M_n}^{(n)}\}$ of size $M_n$, where the superscript $(\cdot)^{(n)}$ is used to denote the $n^{th}$ UE. When active, the $n^{th}$ UE creates the codeword $c^{(n)}$ to be transmitted in accordance with the techniques described herein by the linear combination:

$$c^{(n)} = A^{(n)} s^{(n)},$$

where the columns of the matrix $A^{(n)}$ stack the vectors $a_1^{(n)}, \ldots a_{M_n}^{(n)}$ horizontally, and the elements of the vector $s^{(n)}$ are complex-valued coefficients. The information to be transmitted by the $n^{th}$ UE is conveyed by the vector or codeword $c^{(n)}$. The actual information is defined by the way in which the K-dimensional vectors $a_1^{(n)}, \ldots, a_{M_n}^{(n)}$ of the set $\mathbb{A}^{(n)}$ are combined to create the codeword $c^{(n)}$. In other words, the information is encoded in the support of $s^{(n)}$) (the position of the non-zero elements of $s^{(n)}$), i.e., in the way the vector $s^{(n)}$ selects the columns of the matrix $A^{(n)}$, rather than in the complex symbols (elements) of the vector $c^{(n)}$. This is illustrated in FIG. 5 showing an example of an encoding process. FIG. 5 shows in the center the user n having the unique set $\mathbb{A}^{(n)}$ of the vectors $a_1^{(n)}, \ldots, a_{M_n}^{(n)}$. Each of the vectors $a_1^{(n)}, \ldots, a_{M_n}^{(n)}$ defines a complex symbol using a number $n_{RE}$ of resource elements. In the case illustrated in FIG. 5, user n selects from its set $\mathbb{A}^{(n)}$ the three vectors $a_i^{(n)}$, $a_j^{(n)}$, $a_k^{(n)}$ using the vector $s^{(n)}$ of which only the elements $s_i^{(n)}, s_j^{(n)}, s_k^{(n)}$ are non-zero entries. All other elements of the vector $s^{(n)}$ are zeros, thereby not selecting a corresponding vector (the other non-selected vectors are not shown in the FIG.). Thus, when active, a user, like user n, creates the codeword representing the information to be transmitted by linearly combining the sequences or vectors from the unique set $\mathbb{A}^{(n)}$. The information sequence $b^{(n)}$ is encoded in the support (non-zero elements) of $s^{(n)}$, $b^{(n)} \rightarrow \text{supp}(s^{(n)})$. In the example of FIG. 5, user 1 combines two vectors $a_i^{(1)}, a_j^{(1)}$ using a vector $s^{(1)}$ (not shown), and user N uses only a single vector $a_i^{(N)}$ using a vector $s^{(N)}$. For example, when assuming that the unique set of vectors or sequences of user n includes $M_n=6$ sequences, i.e., the user n has $M_n=6$ sequences on disposal, $\mathbb{A}^{(n)} = \{a_1^{(n)}, \ldots, a_{M_6}^{(n)}\}$. As is shown in FIG. 5, each of the $M_n=6$ sequences spans a predefined number nRE of resource elements. The codeword $c^{(n)}$ is constructed by linearly combining two (out of six possible) sequences, yieldin $$\binom{6}{2} = 15$$

different ways in which the two seqences can be selected. When indexing the codewords $c_1^{(n)}, \ldots, c_{15}^{(n)}$ according to the positions of the non-zero elements of the vector $s^{(n)}$, where $c^{(n)} = \sum_{i=1}^{6} s_i^{(n)} a_i^{(n)}$, the following is obtained:

$$b^{(n)} \rightarrow \text{supp}(s^{(n)}) \rightarrow c^{(n)}$$
$$0001 \rightarrow 000011 \rightarrow c_1^{(n)} = s_5^{(n)} a_5^{(n)} + s_6^{(n)} a_6^{(n)}$$
$$0010 \rightarrow 000101 \rightarrow c_2^{(n)} = s_4^{(n)} a_4^{(n)} + s_6^{(n)} a_6^{(n)}$$
$$0011 \rightarrow 000110 \rightarrow c_3^{(n)} = s_4^{(n)} a_4^{(n)} + s_5^{(n)} a_5^{(n)}$$
$$\vdots \quad \vdots \quad \vdots$$
$$1111 \rightarrow 110000 \rightarrow c_{15}^{(n)} = s_1^{(n)} a_1^{(n)} + s_2^{(n)} a_2^{(n)}$$

The message $b^{(n)} = 0000\text{-}000000 \rightarrow c_{15}^{(n)} = 0$ may be interpreted as "user n not active".

Embodiments of the present invention provide an approach for transmitting data in such a way that the respective samples representing the codeword, also referred to as observations, are available at the receiver in a sequence, i.e., not the entire symbols representing the codeword are initially transmitted but only a subset thereof, which allows the receiver to perform computations in between observations to decide whether a transmission phase already provided enough samples allowing recovery of the signal either exactly or a given tolerance from the smallest possible number of observations. This allows UEs to stop transmissions as soon as there is reasonable certainty of either exact or sufficiently accurate reconstruction which, in accordance with embodiments, allows for a way to obtain a run-time guarantee for transmission methods that otherwise lack a-priori performance bounds. Also, the encoding in accordance with the inventive approach is invariant to the channel action under the block-fading assumption with a coherence length not smaller than a dimension of the transmitted vectors. Such methods may circumvent the need for performing explicit channel estimation, for example by transmitting pilot sequences.

In accordance with the embodiments described above, the UE stops transmitting further sub-codewords responsive to the receipt of the acknowledgement from the receiver indicating that an encoded message is successfully decoded at the receiver on the basis of the preceding sub-codeword. In such embodiments, the UE may further be configured to transmit the next sub-codeword in case no such acknowledgement is received or responsive to an explicit non-acknowledgement from the receiver indicating that the encoded information message could not be successfully decoded at the receiver on the basis of the earlier received sub-codeword.

In accordance with embodiments, a UE may register itself with the network and is informed about the shared resources to be used for the random access to network. The UE may register with the wireless communication network when establishing or re-establishing a connection to the wireless communication network. Due to the registration, the base station is actually aware of those UEs from the plurality of possible UEs which are actually active and transmit data. This is also referred to as activity pattern indicating the active UEs. The base station will use codebooks or codewords of those UEs that registered with the wireless communication network. In other words, during the de-mapping process, rather than searching all known codebooks/codewords, the base station may limit the search space to a subset of codewords for those UEs actually registered. This embodiment is advantageous as only those UEs actually sending data are considered at the base station, thereby improving the processing of the received signal and expediting the decoding process. The activity pattern of the UEs $400_1$-$400_N$, also referred to as user activity pattern, is known at the base station, and the UEs $400_1$-$400_N$ use the shared resources 506 by multiplexing layers from the respective active UEs. The multiplexed layers may include any layer over which multiple data streams may be communicated using shared resources of a network, like MIMO spatial layers, OFDMA tones, TDMA layers and others.

In accordance other embodiments, a UE may not register with the network or base station but sends the data as it accesses the base station, i.e., a grant-free massive random access of the UEs is provided. The UEs are aware of the shared resources, e.g., they are defined by the network specification, and the UEs access the wireless communication network when establishing or re-establishing a connection to the wireless communication network for the transmission of data without performing a registration procedure, e.g., access to the network and transmission of data occurs simultaneously.

Embodiments of the inventive approach may be applied both for an uplink communication from one or more transmitters, like UEs, to a receiver, like a base station, and for a downlink from a transmitter, like a base station or a UE, to one or more receivers, like UEs.

In accordance with embodiments described above, the receiver and/or the transmitter includes an antenna, however, the present invention is limited to embodiments having a single antenna. In accordance with other embodiments the receiver and/or the transmitter may have one or more antennas or one or more antenna arrays. Each of the antenna arrays may include a plurality of antenna elements.

Although some aspects of the described concept have been described in the context of an apparatus, it is clear that these aspects also represent a description of the corresponding method, where a block or a device corresponds to a method step or a feature of a method step. Analogously, aspects described in the context of a method step also represent a description of a corresponding block or item or feature of a corresponding apparatus.

Various elements and features of the present invention may be implemented in hardware using analog and/or digital circuits, in software, through the execution of instructions by one or more general purpose or special-purpose processors, or as a combination of hardware and software. For example, embodiments of the present invention may be implemented in the environment of a computer system or another processing system.

Figure 6:
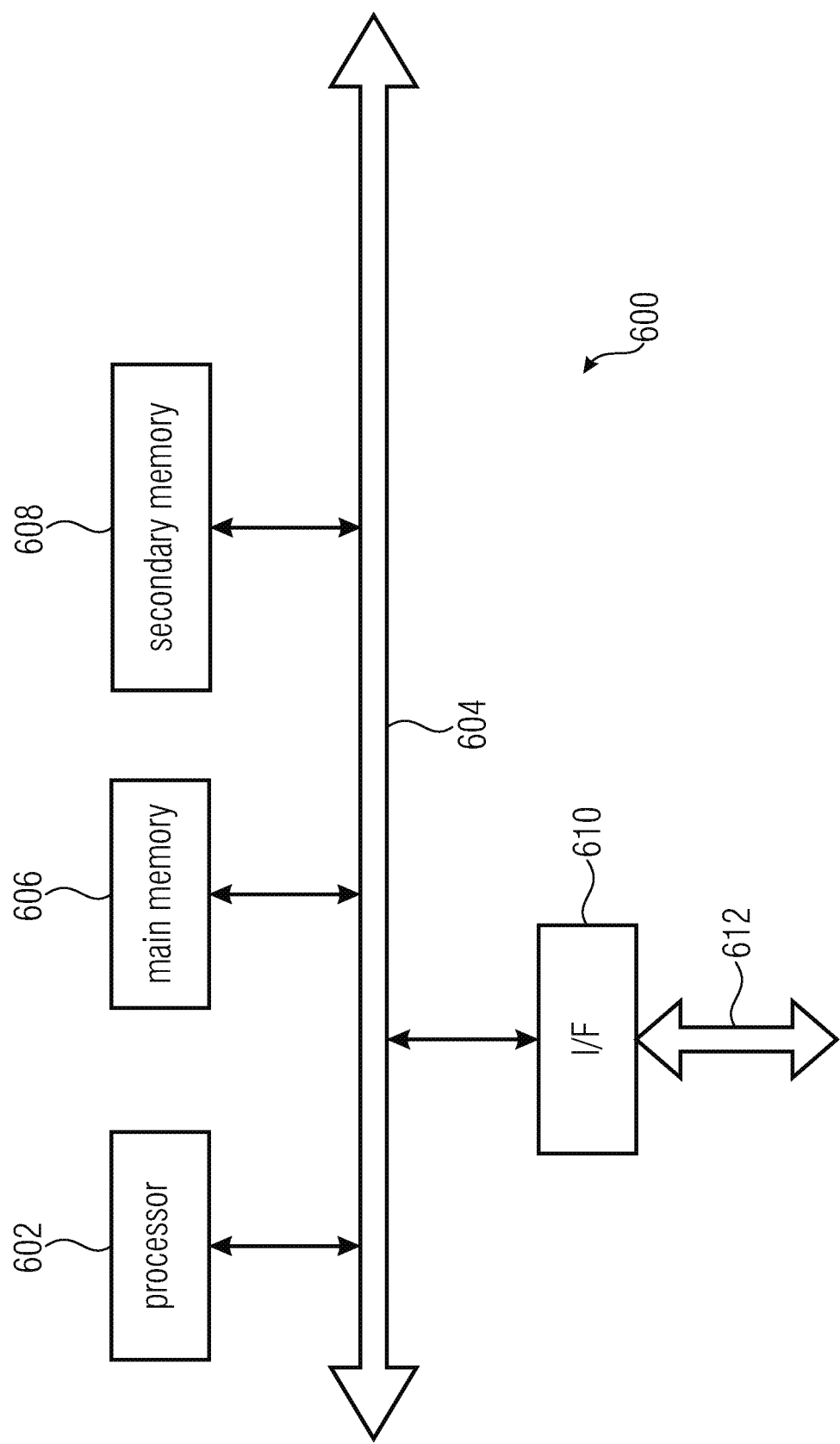
FIG. 6 illustrates an example of a computer system on which units or modules as well as the steps of the methods described in accordance with the inventive approach may execute.

FIG. 6 illustrates an example of a computer system 600. The units or modules as well as the steps of the methods performed by these units may execute on one or more computer systems 600. The computer system 600 includes one or more processors 602, like a special purpose or a general purpose digital signal processor. The processor 602 is connected to a communication infrastructure 604, like a bus or a network. The computer system 600 includes a main memory 606, e.g., a random access memory (RAM), and a secondary memory 608, e.g., a hard disk drive and/or a removable storage drive. The secondary memory 608 may allow computer programs or other instructions to be loaded into the computer system 600. The computer system 600 may further include a communications interface 610 to allow software and data to be transferred between computer system 600 and external devices. The communication may be in the form electronic, electromagnetic, optical, or other signals capable of being handled by a communications interface. The communication may use a wire or a cable, fiber optics, a phone line, a cellular phone link, an RF link and other communications channels 612.

The terms "computer program medium" and "computer readable medium" are used to generally refer to tangible storage media such as removable storage units or a hard disk installed in a hard disk drive. These computer program products are means for providing software to the computer system 600. The computer programs, also referred to as computer control logic, are stored in main memory 606 and/or secondary memory 608. Computer programs may also be received via the communications interface 610. The computer program, when executed, enable the computer system 600 to implement the present invention. In particular, the computer program, when executed, enable processor 602 to implement the processes of the present invention, such as any of the methods described herein. Accordingly, such a computer program may represent a controller of the computer system 600. Where the disclosure is implemented using software, the software may be stored in a computer program product and loaded into computer system 600 using a removable storage drive, an interface, like communications interface 610.

The implementation in hardware or in software may be performed using a digital storage medium, for example cloud storage, a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention may be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier. In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. A further embodiment of the inventive method is, therefore, a data stream or a sequence of signals representing the computer program for performing one of the methods described herein. The data stream or the sequence of signals may for example be configured to be transferred via a data communication connection, for example via the Internet. A further embodiment comprises a processing means, for example a computer, or a programmable logic device, configured to or adapted to perform one of the methods described herein. A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] Sesia, Stefania, Matthew Baker, and Issam Toufik. "LTE-The UMTS Long Term Evolution: From Theory to Practice," 2nd edition, John Wiley & Sons, 2011

[2] B. Wang, L. Dai, T. Mir, and Z. Wang, "Joint User Activity and Data Detection Based on Structured Compressive Sensing for NOMA," IEEE Commun. Lett., vol. 20, no. 7, pp. 1473-1476, July 2016.

[3] B. Wang, L. Dai, Y. Zhang, T. Mir, and J. Li, "Dynamic Compressive Sensing-Based Multi-User Detection for Uplink Grant-Free NOMA," IEEE Commun. Lett., vol. 20, no. 11, pp. 2320-2323, Nov. 2016.

[4] C. Wei, H. Liu, Z. Zhang, J. Dang, and L. Wu, "Approximate Message Passing-Based Joint User Activity and Data Detection for NOMA," IEEE Commun. Lett., vol. 21, no. 3, pp. 640-643, Mar. 2017.

The invention claimed is:

1. A transmitter for transmitting data to a receiver of a wireless communication network, the transmitter comprising:
   at least one antenna,
   a codebook comprising a plurality of codewords, each codeword being a vector comprising a plurality of symbols, each symbol to be transmitted over resources of the wireless communication network,
   an encoder configured
      to receive an information message to be transmitted to a receiver of the wireless communication network,
      to select, from the codebook, the codeword associated with the received information message, and
      to divide the selected codeword into a plurality of sub-codewords, and
   a transceiver coupled to the encoder and to the at least one antenna, the transceiver configured
      to transmit via the at least one antenna a first sub-codeword, and
      to transmit via the at least one antenna a second sub-codeword responsive to an indication that the encoded information message was not successfully decoded at the receiver using the received first sub-codeword,
   wherein the resources of the wireless communication network comprise a plurality of resource elements, wherein at least a subset of the plurality of resource elements is shared by a plurality of transmitters for transmitting data from the plurality of transmitters to the receiver, and wherein the symbols of the vector representing a codebook are transmitted over the shared resource elements of the wireless communication network, and
   wherein the transmitter
      is configured to register with the wireless communication network when establishing or re-establishing a connection to the wireless communication network, the transmitter, responsive to the registration, receiving information indicating the shared resources, or comprises information indicating the shared resources, and the transmitter accesses the wireless communication network using the known shared resources when establishing or re-establishing a connection to the wireless communication network without performing a registration procedure.

2. The transmitter of claim 1, wherein
   the transceiver is configured to stop transmitting the second sub-codeword responsive to an acknowledgement from the receiver, the acknowledgement indicating that the encoded information message was successfully decoded at the receiver using the received first sub-codeword, and
   the transceiver is configured to transmit the second sub-codeword in case no acknowledgement is received from the receiver, or responsive to a non-acknowledgement from the receiver, the non-acknowledgement indicating that the encoded information message was not successfully decoded at the receiver using the received first sub-codeword.

3. The transmitter of claim 1, wherein, following the transmission of the second sub-codeword, the transceiver is configured to continue transmitting further sub-codewords responsive to an indication that the encoded information message was not successfully decoded at the receiver using the sub-codewords received at the receiver.

4. The transmitter of claim 1, wherein the encoder is configured to divide the selected codeword into a plurality of sub-codewords having a same size or different sizes,
   wherein, in case of sub-codewords having different sizes, the size of the sub-codewords increases staring from the first sub-codeword being the shortest sub-codeword.

5. The transmitter of claim 1, comprising a storage, the storage configured to store the codebook.

6. The transmitter of claim 1, wherein the encoder is configured, in case there is no data to be transmitted, to use a predefined codeword, wherein all transmitters in the wireless communication network transmit the same predefined codeword to signal that no data is transmitted.

7. The transmitter of claim 1, wherein each codeword of the codebook has associated therewith an index, wherein an information message received is mapped to an index of a codeword in the codebook, and wherein the encoder is configured to select, from the codebook, the codeword having associated therewith the index to which the received information message is mapped.

8. The transmitter of claim 1, wherein the vector is formed of at least one vector selected from a unique set of vectors, the unique set of vectors exclusively assigned to the transmitter.

9. The transmitter of claim 1, wherein the antenna comprises one or more antennas or one or more antenna arrays, and wherein an antenna array comprises a plurality of antenna elements.

10. A method for transmitting data to a receiver of a wireless communication network, the method comprising:
    receiving an information message to be transmitted to the receiver of the wireless communication network,
    selecting, from a codebook, a codeword associated with the received information, the codebook comprising a plurality of codewords, and each codeword being a vector comprising a plurality of symbols, each symbol to be transmitted over resources of the wireless communication network,
    dividing the selected codeword into a plurality of sub-codewords,
    transmitting a first sub-codeword, and
    transmitting a second sub-codeword responsive to an indication that the encoded information message was not successfully decoded at the receiver using the received first sub-codeword,
    wherein the resources of the wireless communication network comprise a plurality of resource elements, wherein at least a subset of the plurality of resource elements is shared by a plurality of transmitters for transmitting data from the plurality of transmitters to the receiver, and wherein the symbols of the vector representing a codebook are transmitted over the shared resource elements of the wireless communication network, and
    wherein the transmitter
    registers with the wireless communication network when establishing or re-establishing a connection to the wireless communication network, the transmitter, responsive to the registration, receiving information indicating the shared resources, or
    comprises information indicating the shared resources, and the transmitter accesses the wireless communication network using the known shared resources when establishing or re-establishing a connection to the wireless communication network without performing a registration procedure.

11. A non-transitory digital storage medium having stored thereon a computer program for performing, when said computer program is run by a computer, a method for transmitting data to a receiver of a wireless communication network, the method comprising:
receiving an information message to be transmitted to a receiver of the wireless communication network,
selecting, from a codebook, a codeword associated with the received information, the codebook comprising a plurality of codewords, and each codeword being a vector comprising a plurality of symbols, each symbol to be transmitted over resources of the wireless communication network,
dividing the selected codeword into a plurality of sub-codewords,
transmitting a first sub-codeword, and
transmitting a second sub-codeword responsive to an indication that the encoded information message was not successfully decoded at the receiver using the received first sub-codeword,
wherein the resources of the wireless communication network comprise a plurality of resource elements, wherein at least a subset of the plurality of resource elements is shared by a plurality of transmitters for transmitting data from the plurality of transmitters to the receiver, and wherein the symbols of the vector representing a codebook are transmitted over the shared resource elements of the wireless communication network, and
wherein the transmitter
registers with the wireless communication network when establishing or re-establishing a connection to the wireless communication network, the transmitter, responsive to the registration, receiving information indicating the shared resources, or
comprises information indicating the shared resources, and the transmitter accesses the wireless communication network using the known shared resources when establishing or re-establishing a connection to the wireless communication network without performing a registration procedure.

12. A receiver for a wireless communication network, the wireless communication network comprising a plurality of resource elements, at least a subset of the plurality of resource elements shared by a plurality of transmitters for transmitting data from the plurality of transmitters to the receiver, the receiver comprising:
at least one antenna,
a transceiver coupled to the at least one antenna, the transceiver configured to receive via the at least one antenna a receive signal on the subset of resource elements, wherein the receive signal comprises sub-codewords associated with information messages to be transmitted by the respective transmitters, each sub-codeword acquired by dividing, at the transmitter, a codeword into a plurality of sub-codewords, and
a decoder coupled to the transceiver, the decoder configured to acquire from the receive signal the plurality of sub-codewords, to determine, for each transmitter, whether the information message transmitted by the transmitter can be decoded successfully using the received sub-codeword associated with the transmitter, and to decode an encoded information message from a transmitter, in case decoding using the sub-codeword is possible,
wherein the decoder is configured to determine the decodability of an encoded information message and/or an inactive transmitter using log-likelihood ratios associated with the codewords constructed from the received sub-codeword.

13. The receiver claim 12, wherein the decoder is configured to determine inactive transmitters not transmitting an information message responsive to a sub-codeword acquired from a predefined codeword, wherein all transmitters in the wireless communication network transmit the same predefined codeword to signal that no data is transmitted.

14. The receiver of claim 12, wherein the transceiver configured to send an acknowledgement to one or more of the transmitters, the acknowledgement indicating that the encoded information message can be successfully decoded using the received sub-codeword.

15. The receiver of claim 12, wherein the transceiver configured to send a non-acknowledgement to one or more of the transmitters, the non-acknowledgement indicating that the encoded information message cannot by successfully decoded on the basis of using the received sub-codeword.

16. The receiver of claim 12, wherein, in case it is determined for one or more transmitters, that the information message transmitted cannot be decoded successfully using the received sub-codeword associated with the receiver transmitter,
the transceiver is configured to receive via the at least one antenna a further receive signal comprising further sub-codewords from the one or more transmitters, and
the decoder is configured to determine, for each of the one or more transmitters, whether the information message transmitted can be decoded successfully using the received sub-codewords associated with the transmitter.

17. The receiver of claim 16, wherein the further receive signal also comprises one or more sub-codewords associated with codewords representing new information messages from one or more transmitters for which the earlier information message was decoded successfully using the sub-codeword.

18. The receiver of claim 12, configured for a wireless communication with a plurality of transmitters for transmitting data to the receiver, each of the plurality of transmitters comprising:
at least one antenna,
a codebook comprising a plurality of codewords, each codeword being a vector comprising a plurality of symbols, each symbol to be transmitted over resources of the wireless communication network,
an encoder configured
to receive an information message to be transmitted to the receiver,
to select, from the codebook, the codeword associated with the received information message, and
to divide the selected codeword into a plurality of sub-codewords, and
a transceiver coupled to the encoder and to the at least one antenna, the transceiver configured
to transmit via the at least one antenna a first sub-codeword, and
to transmit via the at least one antenna a second sub-codeword responsive to an indication that the encoded information message was not successfully decoded at the receiver using the received first sub-codeword.

19. The receiver of claim 12, wherein the antenna comprises one or more antennas or one or more antenna arrays, and wherein an antenna array comprises a plurality of antenna elements.

20. A wireless communication network, comprising:
a receiver of claim 12, and
a plurality of transmitters for transmitting data to the receiver, each of the plurality of transmitters comprising:
at least one antenna,
a codebook comprising a plurality of codewords, each codeword being a vector comprising a plurality of symbols, each symbol to be transmitted over resources of the wireless communication network,
an encoder configured
to receive an information message to be transmitted to the receiver of the wireless communication network,
to select, from the codebook, the codeword associated with the received information message, and
to divide the selected codeword into a plurality of sub-codewords, and a transceiver coupled to the encoder and to the at least one antenna, the transceiver configured
to transmit via the at least one antenna a first sub-codeword, and
to transmit via the at least one antenna a second sub-codeword responsive to an indication that the encoded information message was not successfully decoded at the receiver using the received first sub-codeword,
wherein the signals from the plurality of transmitters are multiplexed and transmitted to the receiver over shared resources of the wireless communication network.

21. The wireless communication network of claim 20, wherein the receiver is a mobile terminal, an IoT device or a base station of the wireless communication network, and wherein the transmitter is a mobile terminal, an IoT device or a base station of the wireless communication network.

22. The wireless communication network of claim 20, using an IFFT (Inverse Fast Fourier Transform) based signal, wherein the IFFT based signal comprises OFDM with CP, DFT-s-OFDM with CP, IFFT-based waveforms without CP, f-OFDM, FBMC, GFDM or UFMC.

23. A method for receiving data at a receiver of a wireless communication network, the wireless communication network comprising a plurality of resource elements, at least a subset of the plurality of resource elements shared by a plurality of transmitters for transmitting data from the plurality of transmitters to the receiver, the method comprising:
receiving a receive signal on the subset of resource elements, wherein the receive signal comprises sub-codewords associated with information messages to be transmitted by the respective transmitters, each sub-codeword acquired by dividing, at the transmitter, a codeword into a plurality of sub-codewords,
acquiring from the receive signal the plurality of sub-codewords,
determining, for each transmitter, whether the information message transmitted by the transmitter can be decoded successfully using the received sub-codeword associated with the transmitter, and
decoding an encoded information message from a transmitter, in case decoding using the sub-codeword is possible,
wherein decoding comprises determining the decodability of an encoded information message and/or an inactive transmitter using log-likelihood ratios associated with the codewords constructed from the received sub-codeword.

24. A non-transitory digital storage medium having stored thereon a computer program for performing, when said computer program is run by a computer, a method for receiving data at a receiver of a wireless communication network, the wireless communication network comprising a plurality of resource elements, at least a subset of the plurality of resource elements shared by a plurality of transmitters for transmitting data from the plurality of transmitters to the receiver, the method comprising:
receiving a receive signal on the subset of resource elements, wherein the receive signal comprises sub-codewords associated with information messages to be transmitted by the respective transmitters, each sub-codeword acquired by dividing, at the transmitter, a codeword into a plurality of sub-codewords,
acquiring from the receive signal the plurality of sub-codewords,
determining, for each transmitter, whether the information message transmitted by the transmitter can be decoded successfully using the received sub-codeword associated with the transmitter, and
decoding an encoded information message from a transmitter, in case decoding using the sub-codeword is possible,
wherein decoding comprises determining the decodability of an encoded information message and/or an inactive transmitter using log-likelihood ratios associated with the codewords constructed from the received sub-codeword.

* * * * *